United States Patent
Zhang et al.

(10) Patent No.: US 11,799,374 B2
(45) Date of Patent: Oct. 24, 2023

(54) VERTICAL POWER DELIVERY PACKAGING STRUCTURE

(71) Applicant: International Business Machines Corporation, Armonk, NY (US)

(72) Inventors: Xin Zhang, Chappaqua, NY (US); Todd Edward Takken, Brewster, NY (US); Yuan Yao, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/476,586

(22) Filed: Sep. 16, 2021

(65) Prior Publication Data

US 2023/0078561 A1 Mar. 16, 2023

(51) Int. Cl.
*H05K 1/18* (2006.01)
*H02M 3/00* (2006.01)
*H05K 3/30* (2006.01)

(52) U.S. Cl.
CPC ............ *H02M 3/003* (2021.05); *H05K 1/181* (2013.01); *H05K 3/303* (2013.01); *H05K 2201/10325* (2013.01); *H05K 2201/10719* (2013.01)

(58) Field of Classification Search
CPC .................................................... H02M 3/003
USPC ........................................................ 361/783
See application file for complete search history.

(56) References Cited

U.S. PATENT DOCUMENTS

| | | | |
|---|---|---|---|
| 6,452,113 B2 | 9/2002 | Dibene, II | |
| 8,018,738 B2 | 9/2011 | Doblar | |
| 10,403,992 B1* | 9/2019 | Mason | H01R 13/2442 |
| 10,655,838 B1* | 5/2020 | Aikala | F21V 3/061 |
| 2004/0100778 A1* | 5/2004 | Vinciarelli | H05K 1/141 |
| | | | 361/768 |
| 2007/0222059 A1* | 9/2007 | Roberts | H05K 1/0262 |
| | | | 257/691 |
| 2008/0239683 A1* | 10/2008 | Brodsky | H01R 12/52 |
| | | | 29/854 |
| 2016/0381823 A1* | 12/2016 | Ye | H05K 1/182 |
| | | | 361/736 |
| 2017/0290158 A1* | 10/2017 | Pihlman | H01L 23/50 |

OTHER PUBLICATIONS

"Redefining 48V to PoL regulation for high-power processors and AL ASICs", Victor Power-on-Package, downloaded from the Internet on Mar. 23, 2020, 10 pages, <www.vicorpower.com/industries-and-innovations/power-on-package>.
"Vertical Power Delivery Structure for Ultra-High Current Applications", An IP.com Prior Art Database Technical Disclosure, Authors et. al.: Disclosed Anonymously, IP.com No. IPCOM000255694D, IP.com Electronic Publication Date: Oct. 10, 2018,9 pages.

\* cited by examiner

*Primary Examiner* — Stanley Tso
(74) *Attorney, Agent, or Firm* — Aaron Pontikos

(57) ABSTRACT

A package structure is disclosed. The package structure includes processor die connected to a top surface of a package substrate. The package structure further includes a DC-DC power converter attached to a bottom surface of the package substrate. The DC-DC power converter is located at least within an open area of an interconnect component that connects the bottom surface of the package substrate and a top surface of a motherboard.

13 Claims, 6 Drawing Sheets

VERTICAL POWER DELIVERY PACKAGING STRUCTURE

BACKGROUND OF THE INVENTION

The present invention relates generally to the field of assembling and packaging electronic components, and more particularly to assembling and packaging electronic components to provide vertical power delivery to a chip.

Electronics assembly and packaging is the mounting and interconnecting of integrated circuits, connection interfaces, and various other components onto a printed circuit board (PCB) or motherboard. Packaging is the final manufacturing process transforming semiconductor devices into functional products for the end user. Packaging provides electrical connections for signal transmission, power input, and voltage control.

SUMMARY

According to one embodiment of the present invention, a package structure is disclosed. The package structure includes a processor die connected to a top surface of a package substrate. The package structure further includes a DC-DC power converter attached to a bottom surface of the package substrate. The DC-DC power converter is located at least within an open area of an interconnect component that connects the bottom surface of the package substrate and a top surface of a motherboard.

According to another embodiment of the present invention, a package structure is disclosed. The package structure includes a processor die connected to a top surface of a package substrate. The package structure further includes a DC-DC power converter attached to a bottom surface of the package substrate. The DC-DC power converter provides DC output current to the processor die vertically through the package substrate, and directly receives input power and current from an electrical input cable located external to the package substrate.

According to another embodiment of the present invention, a method of fabricating a package structure is disclosed. The method includes attaching a top surface of a DC-DC power converter to a bottom surface of a package substrate. The method further includes attaching an electrical input cable to an electromechanical connector of the DC-DC power convertor. The DC-DC power converter directly receives input power and current from the electrical input cable located external to the package substrate.

DETAILED DESCRIPTION

Figure 1:
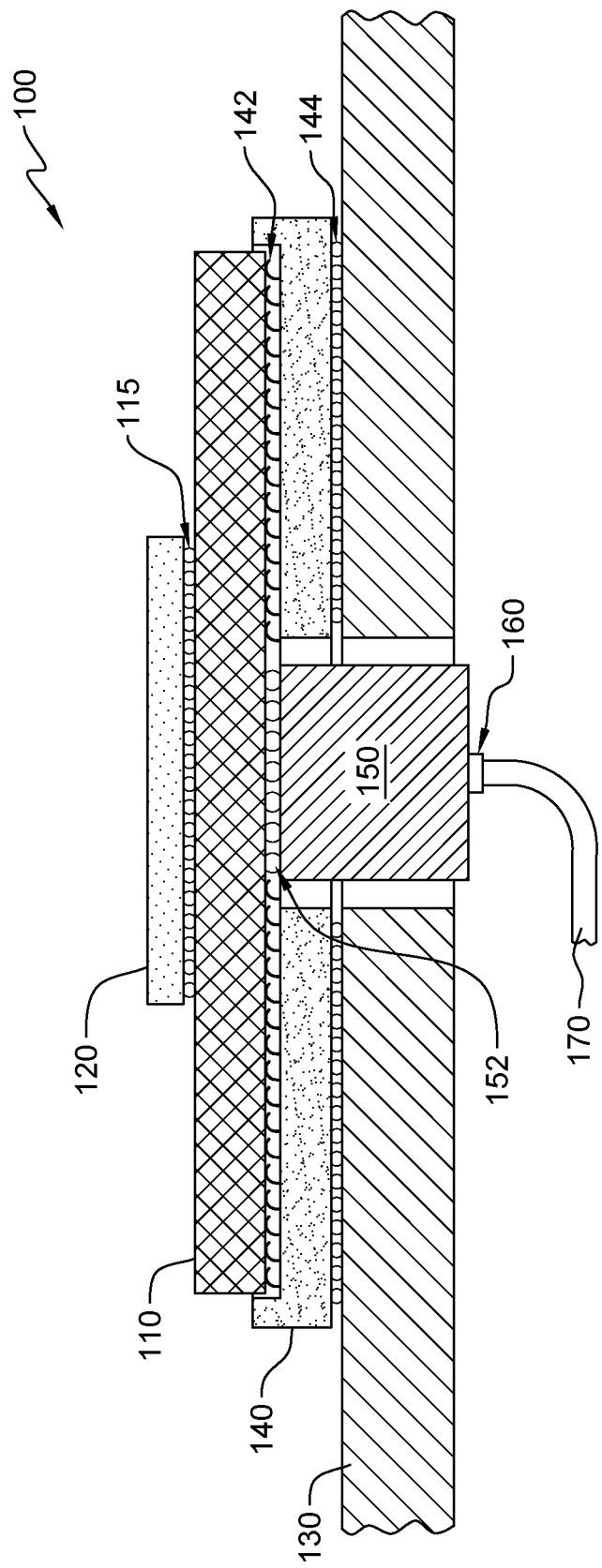
FIG. 1 illustrates a cross-sectional view of a package structure 100 having a DC-DC power convertor 150 connected to a bottom surface of a package substrate 110 in accordance with at least one embodiment of the present invention.

Processor power consumption has been increasing in modern computing systems due to the increasing needs of computation in various applications, such as machine learning, artificial intelligence, and quantum computing. However, it continues to remain a challenge as to how to deliver the high current required to processors or accelerators in high performance computing (HPC) systems.

Embodiments of the present invention recognize that packaging is now the limiting factor in cost and performance for many types of electronic devices. Near term difficult challenges exit in all phases of the assembly and packaging process from design through manufacturing, testing, and reliability. Whereas current packaged integrated circuits (ICs), such as three-dimensional (3D) integrated circuits, multi-chip modules (MCMs), and application specific integrated circuits (ASICs) require large amounts of current into and out of their respective packages during operation, these large current requirements can pose significant challenges in providing the required conductive paths for power. Traditional power delivery technologies laterally deliver power through a package substrate to a processor. However, by doing so, a voltage drop (IR drop), and dielectric breakdown increases as the lateral distance that the current travels increases. This results in not only an excessive amount of wasted energy, but also significant challenges to voltage regulations of the processor.

To address current power delivery problems in conjunction with increasing processor current demand, embodiments of the present invention provide for a packaging structure that achieves high power density with low power density loss when delivering power to a processor. Specifically, embodiments of the present invention provide for a structure and methods for forming a structure having one or more DC-DC power converters attached to the bottom surface of a package substrate. Accordingly, by attaching the DC-DC power converter to the bottom surface of the package substrate, and particularly at a position on the bottom surface of the package substrate that is underneath a processor attached to a top surface of the package substrate, direct vertical supply of power and elimination of any lateral current movement from the DC-DC convertor to the processor is achieved. Similarly, by attaching the DC-DC power converter directly to the bottom surface of the package substrate rather than to the bottom of a PCB or motherboard, the vertical current movement from the DC-DC-power convertor to the processor is also reduced.

Furthermore, unlike traditional power technologies, in which input power is brought to the DC-DC power converter laterally through the substrate, embodiments of the present invention provide for a structure that vertically brings input power directly to the DC-DC power converter attached to the bottom surface of the package substrate without passing through the package substrate. In embodiments of the present invention, high voltage, low current input power is brought directly to a DC-DC power convertor mounted to the bottom surface of a package substrate through cables or other electrical connections that allow for the flow of electricity through them. In an embodiment, the input cables or other electrical connections bringing input power to the DC-DC power convertor mounted to the bottom surface of the package substrate are vertically routed through the motherboard connected to the package substrate and connected to the bottom surface of the DC-DC power convertor. Accordingly, by routing the cables or other electrical connection vertically through the motherboard, direct vertical supply of input power and elimination of any lateral movement of input power supply from the PCB to the DC-DC power convertor is also achieved.

It should be noted that although embodiments of the invention are depicted as having a single processor die that is horizontally arranged on a package substrate, embodiments of the present invention can be practiced with multiple processor dies stacked vertically on top of each other or tiled horizontally with respect to each other. Moreover, although illustrative examples throughout are directed towards a single DC-DC power converter attached to the bottom surface of a package substrate, embodiments of the present invention can be expanded to include multiple DC-DC power converters attached to the bottom surface of the same package substrate. Similarly, although illustrative examples throughout are directed towards a single DC-DC power convertor providing power to a processor die, embodiments of the present invention can be expanded to include a single multiple DC-DC power convertor that delivers power vertically to multiple processor dies stacked vertically on top of each other, or multiple DC-DC power converters that deliver power to the same processor die.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims. Many modifications and variations of the present invention are possible in light of the above teachings, and could be apparent for those skilled in the art.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

It should be noted that the specification below describes various embodiments of an electronic structure, as well as a description of processing steps for forming the various embodiments of the electronic structure. While the processing steps are not described in an ordered sequence, it should be understood that the processing steps are discussed with respect to various Figures as detailed in the specification below.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below, in conjunction with FIGS. 1-6, embodiments may include an electronic structure and methods of forming an electronic structure, and in particular, an electronic structure that brings input power through cables or other electrical connections to a DC-DC power converter that is attached to the bottom surface of a package substrate. The methods described below in conjunction with FIGS. 1-6 may be incorporated into typical assembly and packaging processes of integrated circuits, connection interfaces, and various other components onto a printed circuit board (PCB) or motherboard.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

Those skilled in the art will understand that many different techniques may be used to add, remove, and/or alter various materials, and portions thereof, and that embodiments of the present invention may leverage combinations of such processes to produce the structures disclosed herein without deviating from the scope of the present invention. Similarly, those skilled in the art will understand that many different techniques may be used to attach, connect, and interface (mechanically and/or electrically) one component with another, and that embodiments of the present invention may leverage combination of such techniques to produce the structures disclosed herein without deviating from the scope of the present invention.

The present invention will now be described in detail with reference to the Figures. FIGS. 1-6 include various cross-sectional views and exploded cross-sectional views depicting illustrative steps of a method for assembling and packaging an electronic structure and the resulting electronic structures according to select embodiments of the present invention. One having ordinary skill in the art will appreciate that there are many options available for manufacturing the structures described herein, and that the following discussion does not limit embodiments to only the techniques described herein.

Referring now to FIGS. 1-5, FIGS. 1-5 illustrate various cross-sectional views depicting package structures 100-500, each having a DC-DC power convertor attached to a bottom surface of a package substrate 110. Package structures 100-500 include a processor die 120 bonded to the top surface of package substrate 110 by solder balls 115. One of ordinary skill in the art will appreciate that package substrate 110 can be made from any generally known substrates (e.g., a glass/ceramic substrate, an organic laminate, or printed circuit board (PCB)) that provide processor die 120 with structural base support and a form of electrical interface. Similarly, one of ordinary skill in the art will appreciate that processor die 120 can be made from any generally known semiconductor materials (e.g., silicon, gallium arsenide or germanium).

Package structures 100, 200, 400, and 500 include interconnect component 140 that provides electrical and mechanical (i.e., electromechanical) connections between a motherboard 130 and processor die 120. The top surface of interconnect component 140 is connected to the bottom surface of package substrate 110 and the bottom surface of interconnect component 140 is connected to the top surface of motherboard 130. As depicted in FIGS. 1, 2, 4, and 5, interconnect component 140 is a land grid array (LGA) socket, and in particular, a hybrid LGA socket, in which springs 142 located on the top surface of interconnect component 140 are connected to pads 112 (depicted in FIG. 6) located on the bottom surface of package substrate 110, and the bottom surface of connector component 140 is connected to motherboard 130 by solder balls 144 arranged to form a ball grid array (BGA) (depicted in greater detail in FIG. 6). In an alternative embodiment, interconnect component 140 is a dual LGA socket, in which the top surface of interconnect component 140 is connected to the bottom surface of package substrate 110 by spring contacts 142, and solder balls 144 are replaced with spring contacts (not depicted), such that the bottom surface of interconnect component 140 is connected to motherboard 130 by spring contacts. In an alternative embodiment, interconnect component 140 is a pin grid array (PGA) socket. In an alternative embodiment, interconnect component 140 is a hybrid PGA socket, in which the top surface of interconnect component 140 is connected to the bottom surface of package substrate 110 by pins (not depicted), and the bottom surface of interconnect component 140 is connected to motherboard 130 by solder balls 144. In an alternative embodiment, interconnect component 140 is a dual PGA socket, in which the top surface of interconnect component 140 is connected to the bottom surface of package substrate 110 by a first set of pins (not depicted), and the bottom surface of interconnect component 140 is connected to motherboard 130 by a second set of pins (not depicted).

Figure 3:
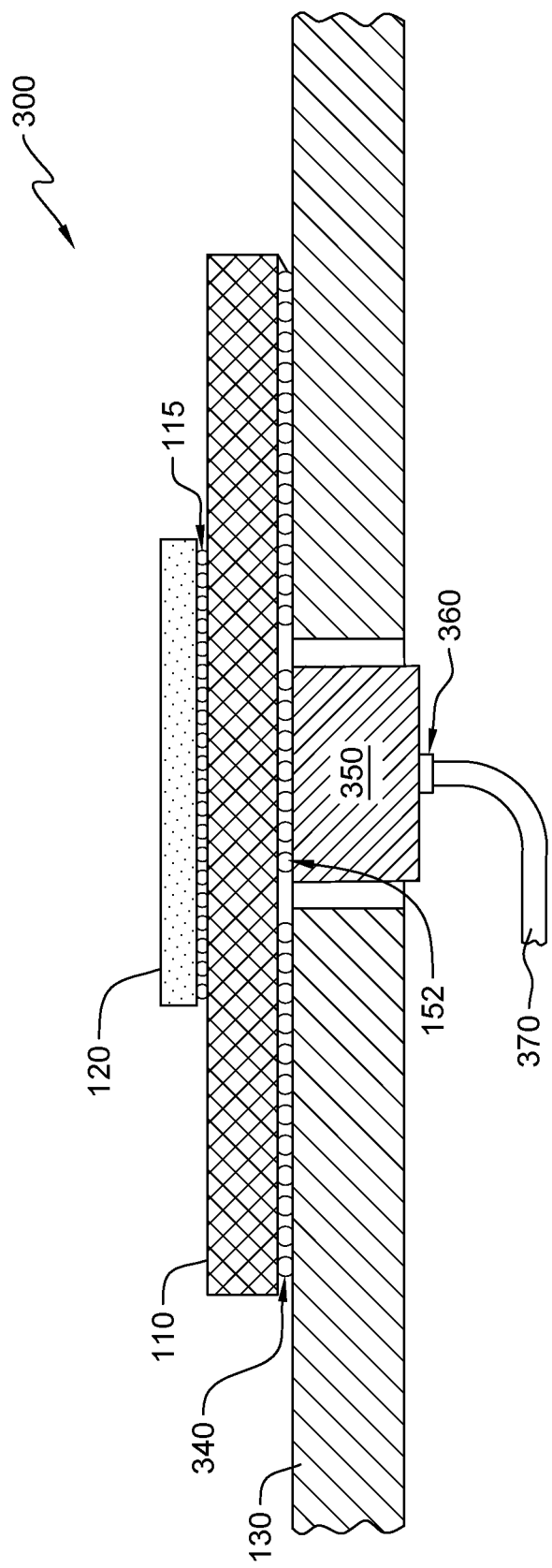
FIG. 3 illustrates a cross-sectional view of a package structure 300 having a DC-DC power convertor 350 attached to a bottom surface of package substrate 110 in accordance with at least one embodiment of the present invention.

Package structure 300 includes interconnect component 340 that provides electrical and mechanical (i.e., electromechanical) connections between motherboard 130 and processor die 120. As depicted in FIG. 3, interconnect component 340 is a plurality of solder balls arranged to form a ball grid array (BGA) (depicted in greater detail in FIG. 6). Here, the top surface of motherboard 130 is bonded to the bottom surface of package substrate 110 by interconnect component 340.

Package structures 100-500 include DC-DC power convertors 150-550, respectively, attached to the bottom surface of package substrate 110. Referring now to FIG. 1, DC-DC power convertor 150 is housed within the voided area of interconnect component 140 and the voided area of motherboard 130. The voided area of interconnect component 140 and motherboard 130 of package structure 100 may be formed by any generally known voiding techniques including, but not limited to, drilling and routing. The voided area of interconnect component 140 extends the entire vertical thickness of interconnect component 140, such that an opening is formed between the top and bottom surfaces of interconnect component 140. Similarly, the voided area of motherboard 130 extends the entire vertical thickness of motherboard 130, such that an opening is formed between the top and bottom surfaces of motherboard 130.

Figure 2:
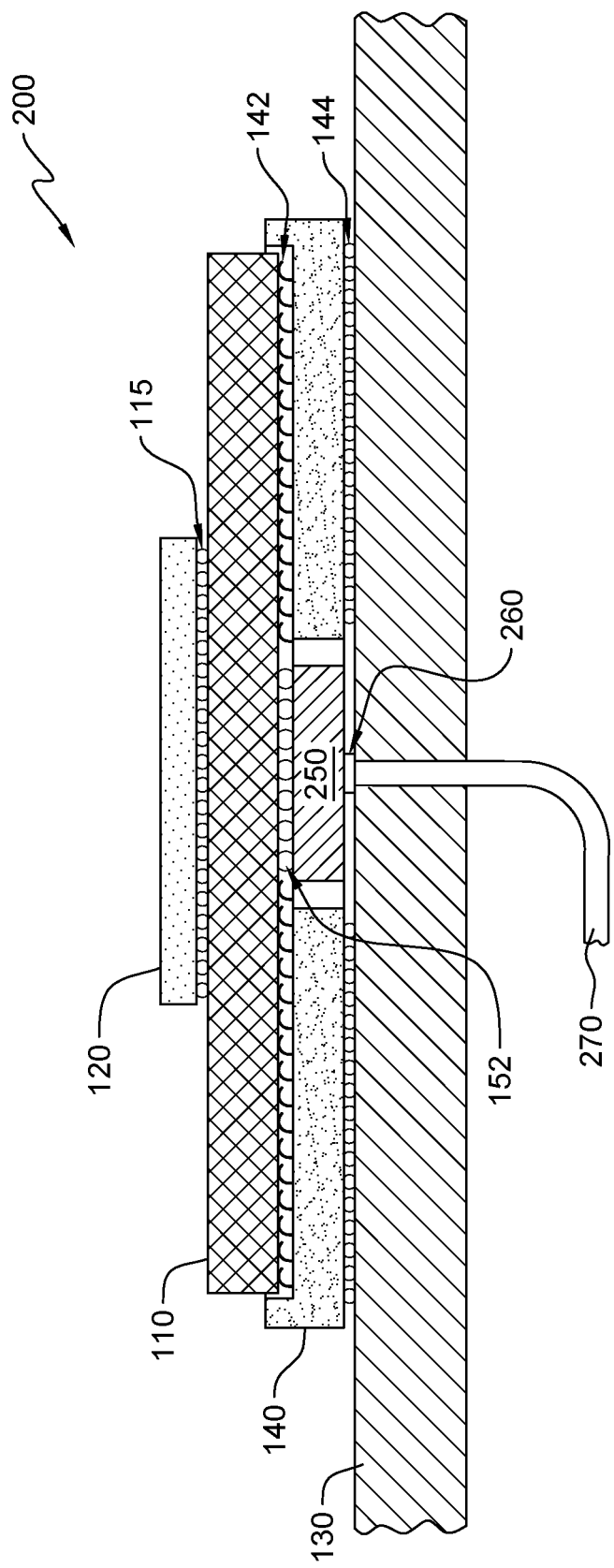
FIG. 2 illustrates a cross-sectional view of a package structure 200 having a DC-DC power convertor 250 connected to a bottom surface of package substrate 110 in accordance with at least one embodiment of the present invention.

Referring now to FIG. 2, DC-DC power convertor 250 is housed within the voided area of interconnect component 140. The voided area of interconnect component 140 of package structure 200 may be formed by any generally known voiding techniques including, but not limited to, drilling and routing. The voided area of interconnect component 140 extends the entire vertical thickness of interconnect component 140, such that an opening is formed between the top and bottom surfaces of interconnect component 140. It should be noted that DC-DC power connector 250 is housed solely within the voided area of interconnect component 140 without the need to void an area in motherboard 130.

Referring now to FIG. 3, DC-DC power convertor 350 is housed within voided area of motherboard 130. The voided area of motherboard 130 may be formed by any generally known voiding techniques including, but not limited to, drilling and routing. The voided area of motherboard 130 extends the entire vertical thickness of motherboard 130, such that an opening is formed between the top and bottom surfaces of motherboard 130. It should be noted that DC-DC power convertor 350 is housed solely within the voided area of motherboard 130 since the top surface of motherboard 130 is electromechanically connected to the bottom surface of substrate 110 by solder balls 340 rather than a socket, such as interconnect component 140 depicted in FIG. 1.

Returning to FIGS. 1-5, a top surface of DC-DC power convertors 150-550 is connected to the bottom surface of package substrate 110. In an embodiment, a plurality of output terminals (not depicted) located on a top surface of DC-DC power convertors 150-550 are electromechanically connected to the bottom surface of package substrate 110. The plurality of output terminals provide vertical power and ground power supplies to processor die 120 connected to package substrate 110. In an embodiment, the plurality of output terminals (not depicted) are electrochemically connected to the bottom surface of package substrate 110 by solder balls 152. However, one of ordinary skill in the art will appreciate that any type of electromechanical connections suitable for attaching the plurality of output terminals (not depicted) of DC-DC power convertors 150-550 to the bottom surface of substrate 110 can be used. For example, in alternative embodiments, a plurality of output terminals of DC-DC power convertors 150-550 can be attached to the bottom surface of package substrate 110 by any generally known types of surface mount packaging technology including, but not limited to, LGA and PGA.

As further depicted in FIGS. 1-5, DC-DC power converters 150-550 include electromechanical input cable connectors 160-560, respectively. Although DC-DC power converters 150-550 are only depicted as having a single electromechanical input cable connector, embodiments of the present invention may be practiced with any number of electromechanical input cable connectors located on the same DC-DC power converter. In an embodiment, electromechanical input cable connectors 160-560 are configured to enable electrical input cables 170-570 to be attached to, detached from, and reattached to electromechanical input cable connectors 160-560, respectively. In an embodiment, electromechanical input cable connectors 160-560 are configured to enable electrical input cables 170-570 to be permanently attached to electromechanical input cable connectors 160-560, respectively.

Electrical input cables 170-570 directly provide input power and current to DC-DC power converters 150-550, respectively, without the input power and current passing through package substrate 110. In an embodiment, current flows vertically from DC-DC power convertors 150-550 connected to the bottom surface of package substrate 110, through package substrate 110, and to processor die 120 connected to the top surface of package substrate 110. Although DC-DC power converters 150-550 are only depicted as having a single electrical input cable connected to electromechanical input cable connectors 160-560, respectively, embodiments of the present invention may be practiced using any number of electromechanical input cable connectors located on the same DC-DC power converter, and any number of electrical input cables respectively connected thereto.

In an embodiment, each of electrical input cables 170-570 include at least one power supply housed within the electrical input cable. In an embodiment, each of electrical input cables 170-570 include at least one power supply and one ground supply housed within an electrical input cable. In an embodiment, each of electrical input cables 170-570 include two or more power supplies housed within the same electrical input cable. In an embodiment, each of electrical input cables 170-570 include two or more power supplies having the same DC input voltages. For example, multiple power supplies connected to a DC-DC power converter may be desired for redundancy purposes. In an embodiment, each of electrical input cables 170-570 includes multiple power supplies having different DC input voltages. For example, different power supplies may be desired to provide different DC input voltages (e.g., 48 V, 54 V, 265 V, 360 V, 385 V or 400 V) to a DC-DC power convertor.

Referring now to FIGS. 1-3, electrical input cables 170-370 are connected to electromechanical input cable connectors 160-360, respectively, located on the bottom surface of DC-DC power converters 150, 250, and 350, respectively. However, in alternative embodiments, electromechanical input cable connectors 160-360 can be located on any surface of DC-DC power converters 150-350, so long as electrical input cables 170-370 are connectable with electromechanical input cable connectors 160-360, respectively. In an embodiment, electrical input cables 170-370 are connected to electromechanical input cable connectors 160-360 after connecting DC-DC power convertors 150-350 to the bottom surface of substrate 110. In an alternative embodiment, electrical input cables 170-370 are connected to electromechanical input cable connectors 160-360 prior to connecting DC-DC power convertors 150-350 to the bottom surface of substrate 110.

Figure 4:
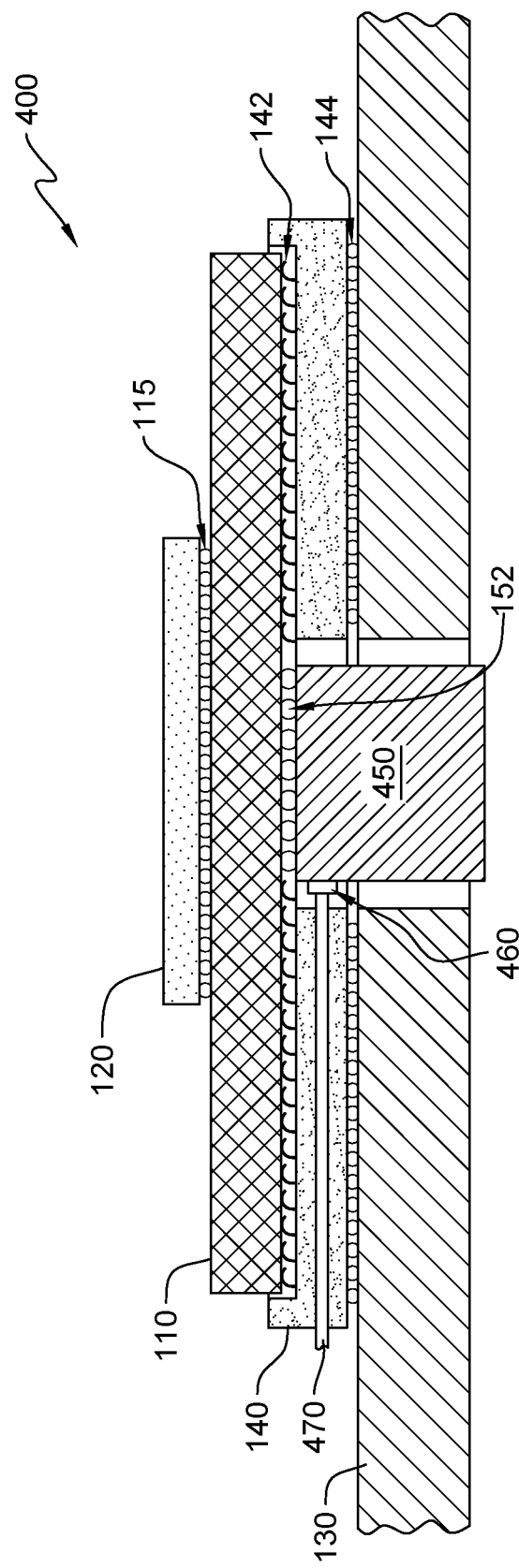
FIG. 4 illustrates a cross-sectional view of a package structure 400 having DC-DC power convertor 450 connected to a bottom surface of package substrate 110 in accordance with at least one embodiment of the present invention.

Referring now to FIG. 4, electrical input cable 470 is connected to electromechanical input cable connector 460 located on a vertical surface of DC-DC power convertor 450. Electrical input cable 470 is routed laterally through interconnect component 140 and connected to electromechanical input cable connector 460. In an embodiment, electromechanical input cable connector 460 is located on a vertical surface of DC-DC power convertor 450 at a position that is substantially planar to electrical input cable 470 routed through interconnect component 140. In an embodiment, electrical input cable 470 is connected to electromechanical input cable connector 460 after connecting DC-DC power convertor 450 to the bottom surface of substrate 110. In an alternative embodiment, electrical input cable 470 is connected to electromechanical input cable connector 460 prior to connecting DC-DC power convertor 450 to the bottom surface of substrate 110.

Figure 5:
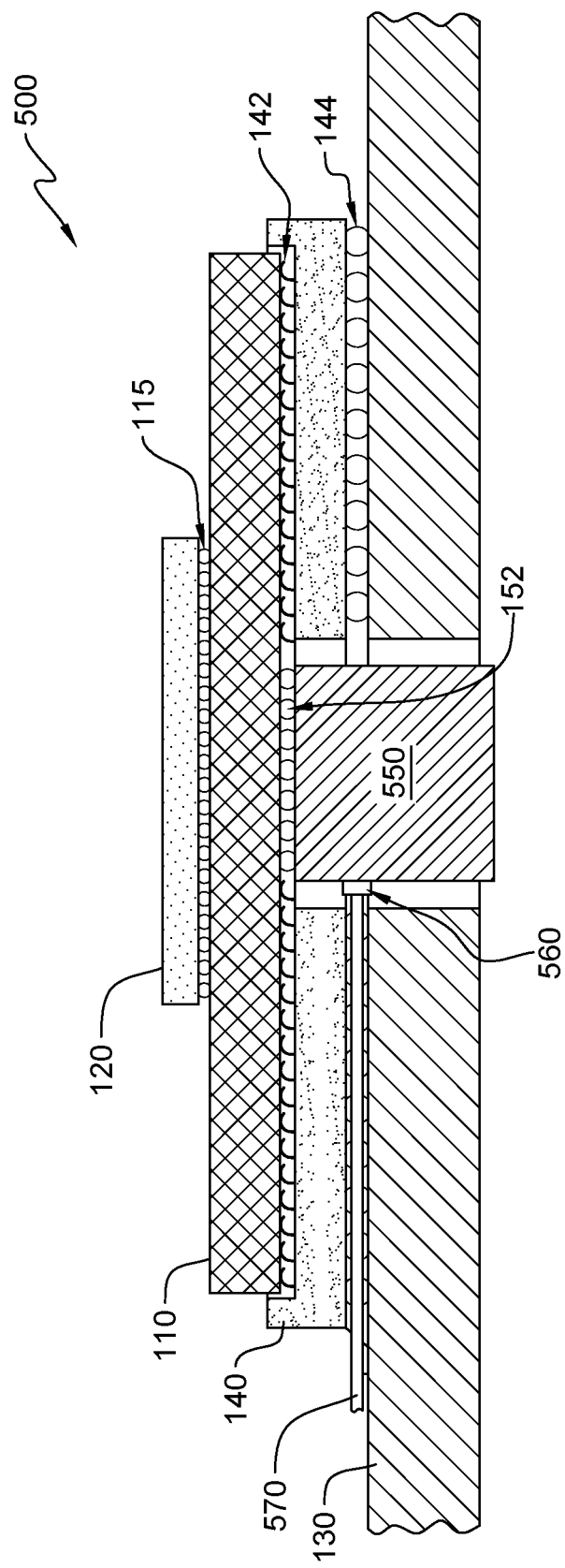
FIG. 5 illustrates a cross sectional view of package structure 500 having DC-DC power convertor 550 connected to a bottom surface of package substrate 110 in accordance with at least one embodiment of the present invention.

Referring now to FIG. 5, electrical input cable 570 is connected to electromechanical input cable connector 560 located on a vertical surface of DC-DC power convertor 550. Electrical input cable 570 is routed laterally between the bottom surface of interconnect component 140 and the top surface of motherboard 130. For example, electrical input cable 570 is routed laterally through an area between the bottom surface of interconnect component 140 and the top surface of motherboard 130 that is devoid of solder balls 144. In an embodiment, electromechanical input cable connector 560 is located on a vertical surface of DC-DC power convertor 550 at a position that is substantially planar to electrical input cable 570 routed between the bottom surface of interconnect component 140 and the top surface of motherboard 130. In an embodiment, electrical input cable 570 is connected to electromechanical input cable connector 560 after connecting DC-DC power convertor 550 to the bottom surface of substrate 110. In an alternative embodiment, electrical input cable 570 is connected to electromechanical input cable connector 560 prior to connecting DC-DC power convertor 550 to the bottom surface of substrate 110.

Figure 6:
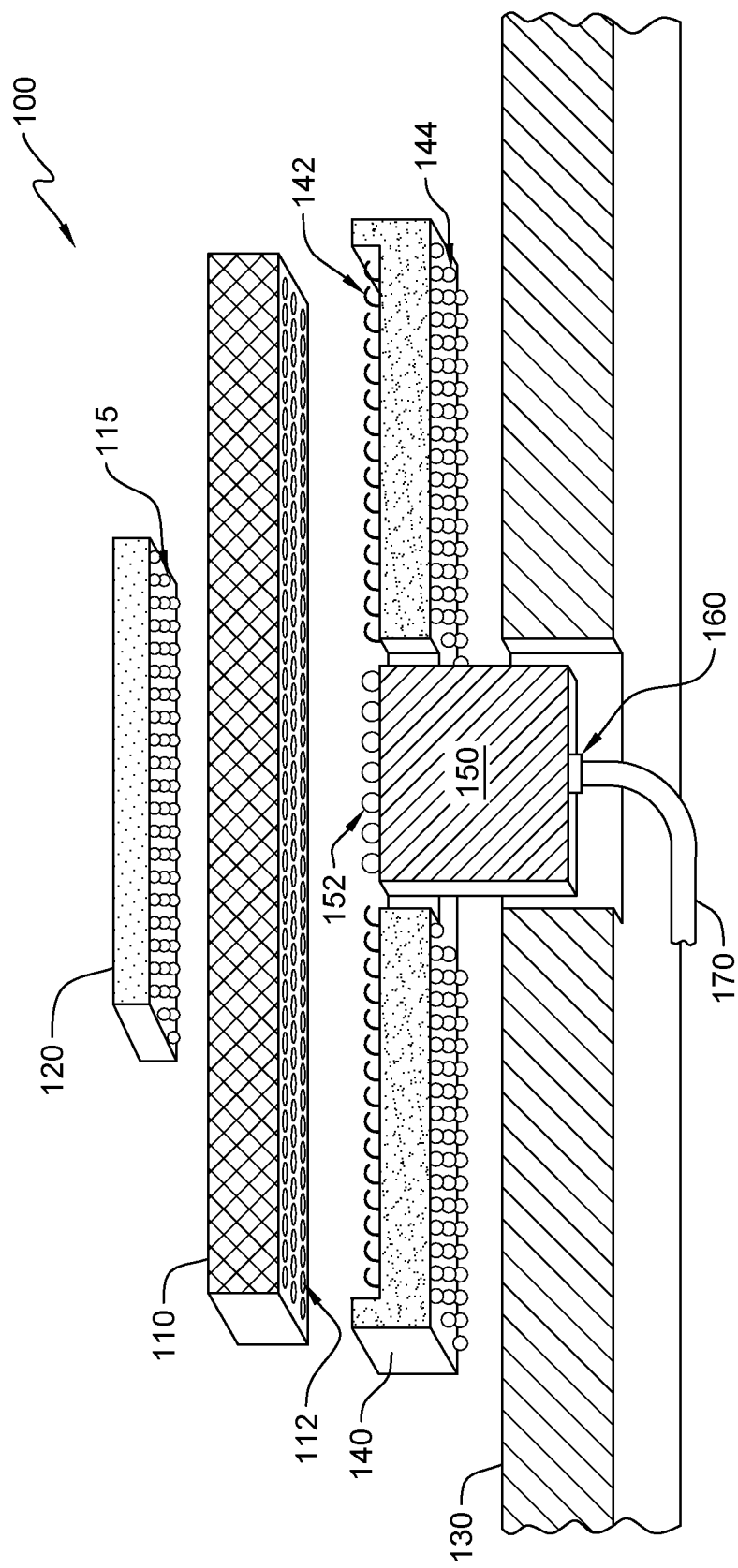
FIG. 6 illustrates an exploded angled cross-sectional view of package structure 100 having DC-DC convertor 150 connected to the bottom surface of package substrate 110 in accordance with at least one embodiment of the present invention.

Referring now to FIG. 6, FIG. 6 depicts an exploded angled cross-sectional view of package structure 100 having DC-DC convertor 150 connected to the bottom surface of package substrate 110 in accordance with at least one embodiment of the present invention. As depicted in FIG. 6, the arrangement of solder balls 115 in a BGA can be seen. Similarly, the arrangement of solder balls 144 in a BGA can been seen. However, it should be appreciated that solder balls 115 and 144 need not form a BGA, and that embodiments of the present invention may be practiced having solder balls 115 and 144 formed in any type of arrangement. As further depicted in FIG. 6, pads 112 located on the bottom surface of substrate 110 can be seen, in which pads 112 form an electrical connection with springs 142 located on the top surface of interconnect component 140.

According to one embodiment of the present invention, a method of fabricating a package structure is provided, the method comprising: attaching a top surface of a DC-DC power converter to a bottom surface of a package substrate; and attaching an electrical input cable to an electromechanical connector of the DC-DC power convertor, wherein the DC-DC power converter directly receives input power and current from the electrical input cable located external to the package substrate.

In an embodiment, the method includes attaching the electrical input cable to the electromechanical connector after the DC-DC power convertor is attached to the bottom surface of the substrate.

In an embodiment, the method includes voiding an area in a interconnect component that connects the bottom surface of the package substrate to a top surface of the motherboard, wherein the area voided in the interconnect component houses the DC-DC power converter.

In an embodiment, the method includes voiding an area in the motherboard, wherein the DC-DC power convertor is housed in the area voided in the interconnect component and the area voided in the motherboard.

In an embodiment, the method includes connecting an electrical input cable to an electromechanical input connection of the DC-DC power converter, wherein the electrical input cable directly provides input power and current to the DC-DC power converter.

In an embodiment, the method includes routing the electrical input cable laterally through an interconnect component that connects the bottom surface of the package substrate to a top surface of the motherboard.

In an embodiment, the method includes routing the electrical input cable between a top surface of the motherboard and a bottom surface of the interconnect component connecting the bottom surface of the package substrate and the top surface of the motherboard.

In an embodiment, the method includes routing the electrical input cable through at least one the motherboard and at least a portion of the interconnect component.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A package structure, comprising:
   an interconnect component located between a package substrate and a motherboard, wherein a top surface of the interconnect component is connected to a bottom surface of the package substrate, and a bottom surface of the interconnect component is connected to a top surface of the motherboard;
   a DC-DC power converter attached to the bottom surface of the package substrate, wherein a plurality of output terminals of the DC-DC power converter are electromechanically connected to the bottom surface of the package substrate via a plurality of solder balls forming a ball grid array (BGA), and wherein the DC-DC power converter is located at least within an open area of the interconnect component located between the package substrate and the motherboard; and
   an electrical input cable that provides input power and current to the DC-DC power converter, wherein the electrical input cable is routed laterally through the interconnect component located between the package substrate and the motherboard.

2. The package structure of claim 1, wherein the DC-DC power converter extends into a second open area below the top surface of the motherboard.

3. The package structure of claim 1, wherein the DC-DC power converter is attached to an area of the bottom surface of the package substrate that is centrally located beneath a processor die connected to a top surface of the package substrate.

4. The package structure of claim 1, wherein the interconnect component is at least one of a hybrid land grid array (LGA) socket and a dual land grid array (LGA) socket.

5. The package structure of claim 1, wherein the interconnect component is a plurality of solder balls forming a ball grid array (BGA).

6. The package structure of claim 1, wherein vertical current flows from the DC-DC power converter connected to the bottom surface of the package substrate, through the package substrate, and to a processor die connected to a top surface of the package substrate.

7. A package structure, comprising:
   a processor die connected to a top surface of a package substrate;
   an interconnect component located between the package substrate and a motherboard, wherein a top surface of the interconnect component is connected to a bottom surface of the package substrate, and a bottom surface of the interconnect component is connected to a top surface of the motherboard;
   a DC-DC power converter attached to the bottom surface of the package substrate, wherein a plurality of output terminals of the DC-DC power converter are electromechanically connected to the bottom surface of the package substrate via a plurality of solder balls forming a ball grid array (BGA), and wherein the DC-DC power converter provides DC output current to the processor die vertically through the package substrate, the DC-DC power converter directly receiving input power and current from an electrical input cable routed laterally through the interconnect component located between the package substrate and the motherboard.

8. The package structure of claim 7, wherein the DC-DC power converter is located at least within an open area of the interconnect component located between the package substrate and the motherboard.

9. The package structure of claim 8, wherein the DC-DC power converter extends into a second open area below the top surface of the motherboard.

10. The package structure of claim 7, wherein the DC-DC power converter is attached to an area of the bottom surface of the package substrate that is centrally located beneath the processor die connected to the top surface of the package substrate.

11. The package structure of claim 7, wherein an electromechanical input connection for connecting the electrical input cable to the DC-DC power convertor is located on a bottom surface of the DC-DC power convertor.

12. The package structure of claim 11, wherein the electromechanical input connection of the DC-DC power convertor enables the electrical input cable to be attached to and detached from the electromechanical input connection.

13. The package structure of claim 7, wherein vertical current flows from the DC-DC power convertor connected to the bottom surface of the package substrate, through the package substrate, and to the processor die connected to the top surface of the package substrate.

\* \* \* \* \*